US009199458B2

(12) United States Patent
Kondo

(10) Patent No.: US 9,199,458 B2
(45) Date of Patent: Dec. 1, 2015

(54) ELECTROMECHANICAL TRANSDUCER ELEMENT, METHOD OF PRODUCING ELECTROMECHANICAL TRANSDUCER ELEMENT, INKJET RECORDING HEAD, AND INKJET RECORDING APPARATUS

(71) Applicant: Naoya Kondo, Kanagawa (JP)

(72) Inventor: Naoya Kondo, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 14/676,190

(22) Filed: Apr. 1, 2015

(65) Prior Publication Data

US 2015/0283811 A1  Oct. 8, 2015

(30) Foreign Application Priority Data

Apr. 8, 2014 (JP) .................... 2014-079403

(51) Int. Cl.
  *B41J 2/045* (2006.01)
  *B41J 2/14* (2006.01)
  *H01L 41/047* (2006.01)
  *H01L 41/09* (2006.01)

(52) U.S. Cl.
  CPC ......... *B41J 2/14201* (2013.01); *H01L 41/0472* (2013.01); *H01L 41/0926* (2013.01)

(58) Field of Classification Search
  CPC .. B41J 2/14201; B41J 2/14233; B41J 2/1601; B41J 2002/14491; H01L 41/0472; H01L 41/0926
  See application file for complete search history.

(56) References Cited

U.S. PATENT DOCUMENTS 5,600,356 A * 2/1997 Sekiya et al. .................. 347/62

FOREIGN PATENT DOCUMENTS

| JP | 11-091103 | 4/1999 |
|---|---|---|
| JP | 2000-094688 | 4/2000 |
| JP | 2004-154987 | 6/2004 |
| JP | 2004-202849 | 7/2004 |
| JP | 2005-223159 | 8/2005 |
| JP | 2006-198996 | 8/2006 |
| JP | 2006-203190 | 8/2006 |
| JP | 2007-135297 | 5/2007 |
| JP | 2010-034154 | 2/2010 |

* cited by examiner

*Primary Examiner* — Juanita D Jackson
(74) *Attorney, Agent, or Firm* — Oblon, McClelland, Maier & Neustadt, L.L.P.

(57) ABSTRACT

An electromechanical transducer element includes a substrate; a common electrode disposed on the substrate; an electromechanical transducer film formed on the common electrode; an individual electrode formed on the electromechanical transducer film; a common electrode pad electrically connected to the common electrode; an individual electrode pad electrically connected to the individual electrode; and an insulation protective film formed on the common electrode and the individual electrode, contacting an upper end of the individual electrode pad, and surrounding a side surface of the individual electrode pad. The insulation protective film has a gradually decreasing thickness outward from an end of the individual electrode pad.

9 Claims, 10 Drawing Sheets

ELECTROMECHANICAL TRANSDUCER ELEMENT, METHOD OF PRODUCING ELECTROMECHANICAL TRANSDUCER ELEMENT, INKJET RECORDING HEAD, AND INKJET RECORDING APPARATUS

CROSS-REFERENCE TO RELATED APPLICATIONS

The present application claims priority pursuant to 35 U.S.C. §119(a) from Japanese patent application number 2014-079403, filed on Apr. 8, 2014, the entire disclosure of which is hereby incorporated by reference herein.

BACKGROUND

1. Technical Field

Exemplary embodiments of the present invention relate to an electromechanical transducer element, a method of producing the electromechanical transducer element, an inkjet recording head incorporating the transducer element, and an inkjet recording apparatus incorporating the inkjet recording head.

2. Background Art

An inkjet recording apparatus or an inkjet recording head used for an image recording apparatus or an image forming apparatus such as a printer, a facsimile machine, or a copier, employs nozzles to discharge ink droplets, a pressure chamber communicating to the nozzles, and an electromechanical transducer element such as a piezoelectric element that pressurizes the ink inside the pressurized chamber. Herein, the pressurized chamber may also be referred to as an ink flow channel, pressurized liquid chamber, pressure chamber, (liquid) discharge chamber, liquid chamber, and the like. Ink inside the pressurized chamber is pressurized by energy generated by an energy generating means, and the ink droplet is discharged from the nozzles.

Two types of inkjet recording heads are known: a thermal inkjet recording head and a piezoelectric inkjet recording head. One piezoelectric inkjet recording head employs a piezoelectric actuator that extends and contracts in an axial direction of the piezoelectric element, and the other piezoelectric actuator employs a piezoelectric actuator of bending and vibrating mode.

SUMMARY

In one embodiment of the disclosure, there is provided an electromechanical transducer element including a substrate; a common electrode disposed on the substrate; an electromechanical transducer film formed on the common electrode; an individual electrode formed on the electromechanical transducer film; a common electrode pad electrically connected to the common electrode; an individual electrode pad electrically connected to the individual electrode; and an insulation protective film formed on the common electrode and the individual electrode, contacting an upper end of the individual electrode pad, and surrounding a side surface of the individual electrode pad. The insulation protective film has a gradually decreasing thickness outward from an end of the individual electrode pad.

In other embodiments of the disclosure, there are provided a method of producing the electromechanical transducer element as described above, and an inkjet recording head and an inkjet recording apparatus employing the electromechanical transducer element as described above.

These and other objects, features, and advantages of the present invention will become apparent upon consideration of the following description of the preferred embodiments of the present invention when taken in conjunction with the accompanying drawings.

DETAILED DESCRIPTION

The piezoelectric element used for the bending and vibrating mode actuator includes a lower electrode as a common electrode, a piezoelectric zirconate titanate (PZT) film formed on the lower electrode, and an upper electrode as an individual electrode formed on the PZT film. In addition, on the upper electrode, an interlayer insulation film is formed to insulate the lower electrode from the upper electrode. A contact hole is formed in the interlayer insulation film. Electrical connection with the upper electrode is established via the contact hole.

Conventionally, a mainly Pt-based metallic electrode has been employed as a lower electrode and PZT's fatigue property has been a concern. One of the factors causing fatigue is degradation due to Pb dispersion in the PZT. In this regard, it is reported that use of an oxide electrode may improve durability.

Figure 1A:
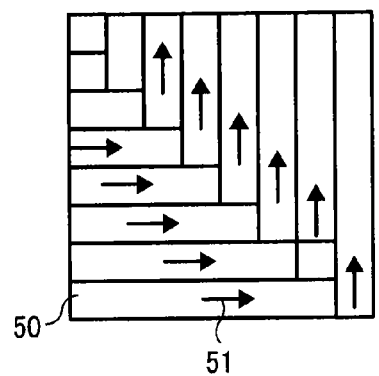
FIGS. 1A and 1B each schematically illustrate changes of domain structure inside a polarized material due to repeated voltage impression.
Figure 1B:
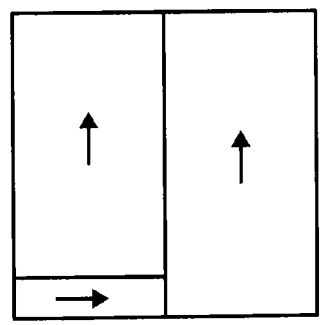

On the other hand, as illustrated in FIG. 1A and FIG. 1B, although orientation 51 of the polarization in the piezoelectric crystals before applying voltage is random, repeated application of voltage produces a domain collection 50 with an aligned orientation of the polarized piezoelectric crystals. Accordingly, alignment of the polarization before applying voltage has been tried, and methods to stabilize displacement with respect to a predetermined driving voltage generally termed polarization treatment (or aging or poling) are known.

More specifically, a method to apply high voltage exceeding the driving pulse voltage to the piezoelectric element has been performed. Furthermore, voltage is applied between the electrode and an electrical charge supplying means to generate a corona discharge, thereby supplying the electrical charge and generating an electric field inside the piezoelectric element.

Assuming treatment at the wafer level using a probe card, producing the probe card itself may increase production costs depending on the number of terminal electrodes, shape of the electrodes, and layout thereof, and there are also technical problems in forming the probe card. When the number of terminal electrodes that one probe card can handle decreases, a substantial length of time is needed for wafer level treatment.

When the corona wire electrode is used for treatment, polarization can be performed across the wafer. When the polarization is performed on the piezoelectric element including an electrode pad, electrical charge is accumulated at other than the target electrode or electrode pad when the electrical charge is applied to the piezoelectric element. In particular, with insulating material around the electrode or the electrode pad, an electric field tends to be generated at an edge portion contacting the insulating material and an electrical charge exceeding a desired electrical charge is concentrated on the electrode or the electrode pad, causing insulation breakdown in the piezoelectric body.

As described above, polarization by the conventional corona discharge produces an excessive electrical charge exceeding a desired amount to be concentrated depending on the state of the insulation protective film around the electrode pad and the electrical charge to be applied excessively. As a result, there is acute demand for an electromechanical transducer element or a piezoelectric element capable of preventing insulation breakdown from occurring while maintaining optimal and stable ink discharging.

Hereinafter, an electromechanical transducer element, a method of producing the electromechanical transducer element, an inkjet recording head, and an inkjet recording apparatus according to exemplary embodiments of the present invention will be described referring to accompanying drawings. However, it should be understood that the present invention is not limited to those examples and elements can be added, modified, and deleted within the scope of the embodiments of the present invention that an engineer in the subject field of art can attain, and includes any of the embodiments as far as effects and performance of the present invention are exerted.

Electromechanical Transducer Element

Figure 2:
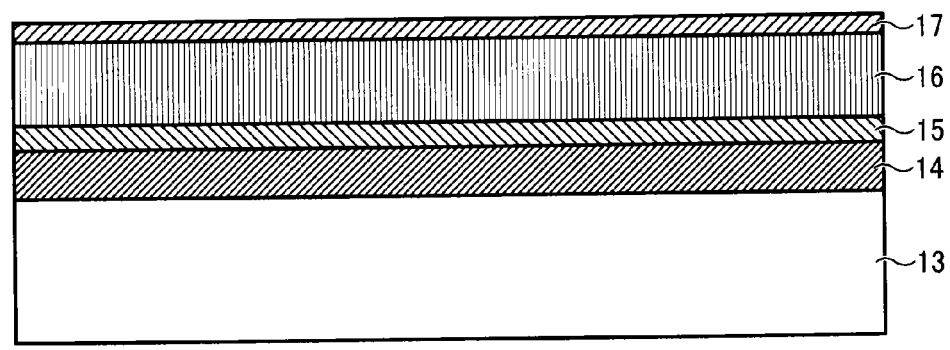
FIG. 2 schematically illustrates an exemplary structure of an electromechanical transducer element.

FIG. 2 schematically illustrates an exemplary structure of an electromechanical transducer element 10A according to an embodiment of the present invention. As illustrated in FIG. 2, the electromechanical transducer element 10A includes a substrate 13, a diaphragm 14, a first electrode 15, an electromechanical transducer film 16, and a second electrode 17.

Figure 3:
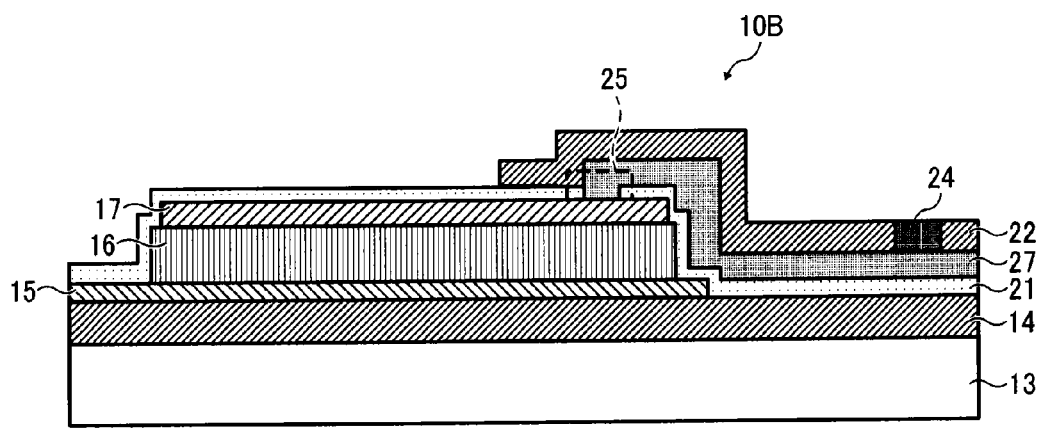
FIG. 3 is a schematic cross-sectional view of another exemplary structure of an electromechanical transducer element.
Figure 4:
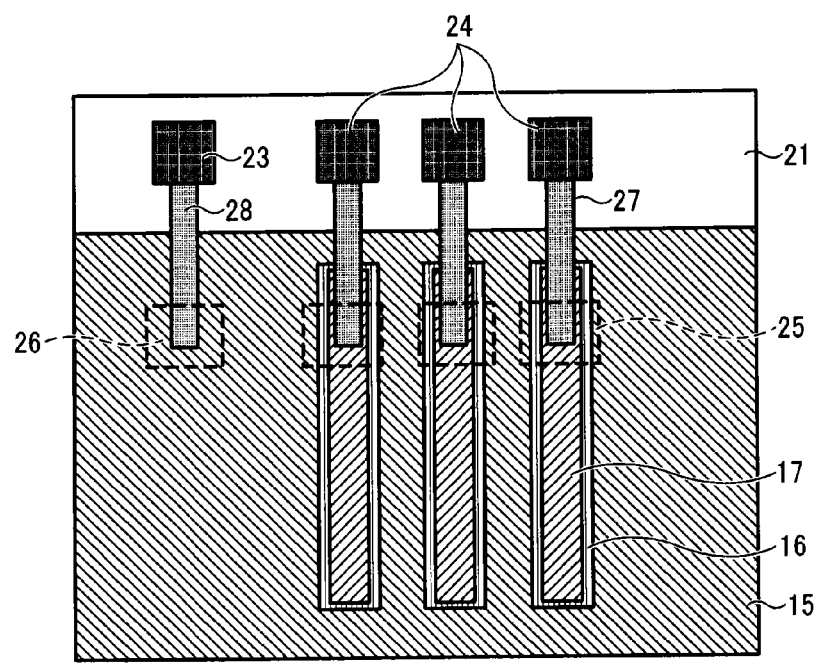
FIG. 4 is a plan view of another exemplary structure of an electromechanical transducer element.

Referring to FIGS. 3 and 4, a structure including an insulation protective film and lead wires will be described.

As illustrated in FIG. 3, provided are the substrate 13, the first electrode 15 as a common electrode formed on the substrate 13, the electromechanical transducer film 16 formed on the first electrode 15, the second electrode 17 as an individual electrode formed on the electromechanical transducer film 16, the second electrode 17 as an individual electrode formed on the electromechanical transducer film 16, the first insulation protective film 21 formed on the first electrode 15, an individual electrode pad 24 connected to the second electrode 17, and a second insulation protective film 22 disposed on the first insulation protective film 21 and surrounding a side surface of the individual electrode pad 24.

The first insulation protective film 21 and the second insulation protective film 22 include contact holes 25, 26, and the common electrode lead wire extends relative to the first electrode 15 and the individual electrode lead wire extends relative to the second electrode 17. In this case, with the first electrode 15 as the common electrode and with the second electrode 17 as the individual electrode, the second insulation protective film 22 to protect the common and individual electrode lead wires is formed. As illustrated in FIGS. 3 and 4, a common electrode pad 23 with a partly open portion and the individual electrode pad 24 are formed. More specifically, FIG. 4 is a schematic view of FIG. 3 seen from above, and the second insulation protective film 22 is omitted.

In the present embodiment, the insulation protective film formed on the common electrode and the individual electrode and surrounding the side surface of the individual electrode pad designates the first insulation protective film 21 and/or the second insulation protective film 22.

Figure 5A:
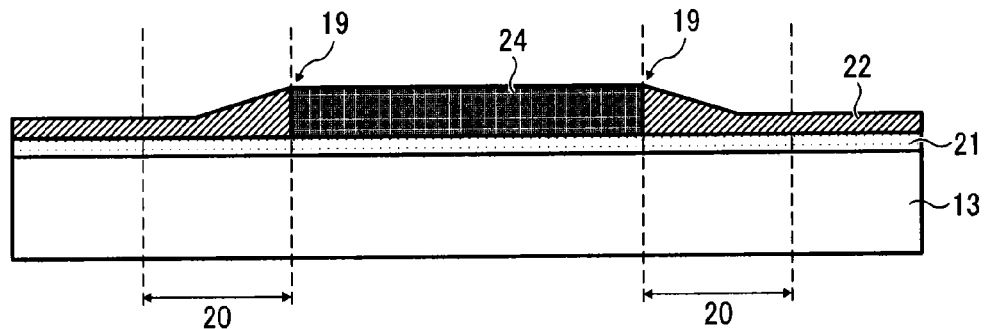
FIGS. 5A to 5C are cross-sectional views each illustrating a structure of an electrode pad and an insulation protective film.
Figure 5B:
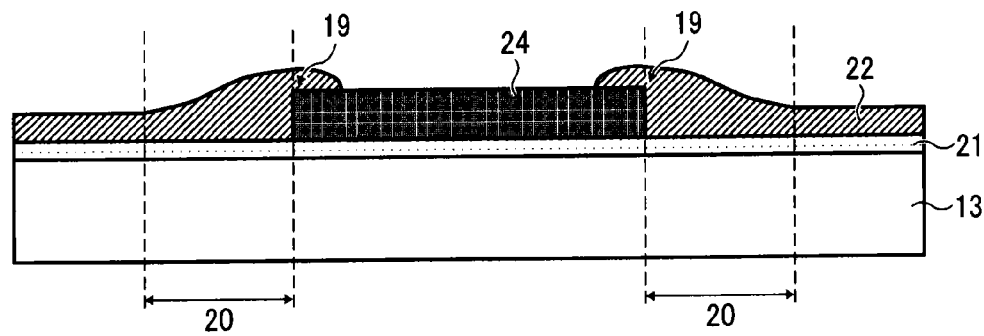
Figure 5C:
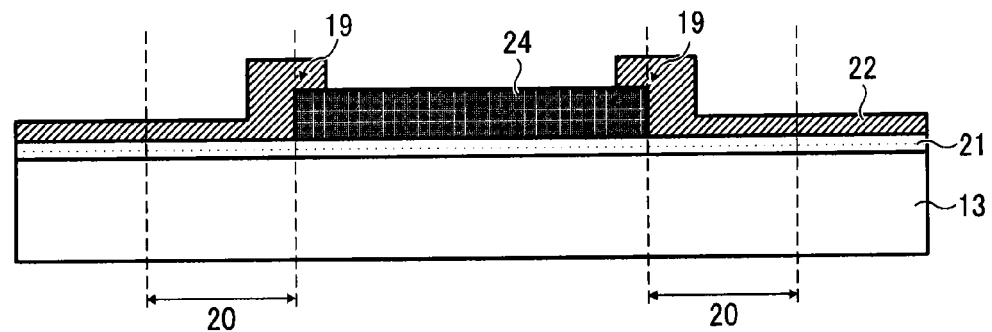

FIGS. 5A to 5C are cross-sectional views each illustrating a structure of an electrode pad and an insulation protective film. As illustrated in FIG. 5, the first insulation protective film 21, the second insulation protective film 22, and the individual electrode pad 24 are formed on the substrate 13. The diaphragm 14, the first electrode 15, the electromechanical transducer film 16, and the second electrode 17 are omitted.

In the polarization treatment, when an electrical charge is applied to a piezoelectric body, the electrical charge is accumulated in parts other than the target electrode or the electrode pad. In particular, when there is insulating material around the electrode or the electrode pad, an electric field tends to be generated at an edge portion contacting the insulating material. As a result, an electrical charge exceeding a desired level is accumulated in the electrode or the electrode pad.

To prevent insulation breakdown, if the second common electrode pad other than the common electrode pad connected to the common electrode is disposed near the individual electrode, polarization can be performed optimally.

However, due to an excessive electric field caused by an interference of the insulating material contacting the electrode or the electrode pad, insulation breakdown occurs, which requires a further improvement.

To cope with demand and expectations, the second insulation protective film 22 is so configured as to contact the upper ends of the individual electrode pad 24 and to have a gradually decreasing thickness from the ends of the individual electrode pad 24 outward. With this configuration, accumulation of the electric field at an edge portion of the electrode pad is prevented, thereby retaining an optimal and stable ink discharge. Further, a crack of the piezoelectric body caused by the insulation breakdown can be prevented.

In FIG. 5A, each of the second insulation protective films 22 contacts an upper end of the individual electrode pad 24 and has a thickness around the surrounding area of the individual electrode pad 24 that gradually decreases from the end of the individual electrode pad 24 outward. The upper end of the individual electrode pad 24 is given a numeral 19 in FIG. 5. In addition, the surrounding area of the individual electrode pad 24 is applied with a numeral 20 in FIG. 5 and is represented by a length; however, in the plan view as illustrated in FIG. 4, the numeral 20 shows an area. The length of the surrounding area of the individual electrode pad 24 is not determined in particular; but, considering the cross-sectional view of FIG. 5, the length is from 30 to 50 μm.

In FIG. 5A, the thickness of the second insulation protective film 22 around the individual electrode pad 24 linearly decreases, but may decrease drawing a curved line.

In FIG. 5A, the thickness of the second insulation protective film 22 is maximum at the position contacting the upper part of the individual electrode pad 24 and gradually decreases from the end of the individual electrode pad 24 outward. In this case, compared to the case of FIG. 5B, the second insulation protective film 22 can be formed preferably by photolithography or dry etching method.

As to FIG. 5B, the thickness of the second insulation protective film 22 gradually decreases from the end of the individual electrode pad 24 outward. In FIG. 5B, the second insulation protective film 22 covers the upper end of the individual electrode pad 24 and the second insulation protective film 22 is formed on the individual electrode pad 24, which is different from FIG. 5A. However, the second insulation protective film 22 can be formed on the individual electrode pad 24. In this case, the second insulation protective film 22 on the individual electrode pad 24 needs to be gradually thinner toward an inner side of the individual electrode pad 24 from an edge thereof. Otherwise, the electric field is concentrated at an edge of the electrode pad.

The second insulation protective film 22 can be formed on the individual electrode pad 24 as illustrated in FIG. 5B; however, considering the plan view of FIG. 4, the area formed on the individual electrode pad 24 should not extend 25% or more of an entire area of the individual electrode pad 24. If more than 25%, in polarization, the electric field cannot be applied to the individual electrode pad 24, resulting in difficulty in performing optimal polarization.

The second insulation protective film 22 can be formed by photolithography or dry etching method when the second insulation protective film 22 is formed on the individual electrode pad 24 as in FIGS. 5A and 5B. As described above, formation of the second insulation protective film 22 is easier in the example of FIG. 5A rather than the case of FIG. 5B, and the conditions of the photolithography or dry etching method for the case of FIG. 5B should be properly selected. One of the conditions includes controlling an etching rate.

An example illustrated in FIG. 5C is a comparative example, in which the thickness of the second insulation protective film 22 around the individual electrode pad 24 does not decrease gradually outward, and the thickness changes non-continuously along the planar surface. In this case, concentration of the electric field at an edge of the electrode pad cannot be prevented, and a crack will appear in the piezoelectric body during polarization. Thus, a stable ink discharge property cannot be obtained.

As illustrated in FIG. 5C, although the second insulation protective film 22 is formed on the individual electrode pad 24, the thickness of the second insulation protective film 22 on the individual electrode pad 24 does not decrease gradually toward an inner side, and the thickness changes non-continuously along the planar surface. Accordingly, the concentration of the electric field at an edge of the electrode pad cannot be prevented.

The example in FIG. 5C is formed by etching based on the conventional lithography and etching conditions.

In addition, in the present invention, the individual electrode pad 24 and the second insulation protective film 22 need to be configured as in FIGS. 5A and 5B. Further, the common electrode pad 23 and the first insulation protective film 21 are preferably configured in a similar manner. In FIGS. 5A to 5C, the individual electrode pad 24 and the second insulation protective film 22 jointly form the electromechanical transducer element. Alternatively, the common electrode pad 23 and the first insulation protective film 21 may be used to form an electromechanical transducer element. With the structure above, concentration of the electric field at an edge of the common electrode pad 23 can be prevented.

Next, each structure of the part and component of the electromechanical transducer element according to the present embodiment will be described in detail.

Substrate

An example of the preferred material for the substrate 13 for the electromechanical transducer element 10B as illustrated in FIG. 3 includes single-crystal silicon, which is formed to have a depth preferably ranging from 100 μm to 600 μm. There are three types of plane orientations for the single-crystal silicon, (100), (110), and (111). In general, (100) and (111) are used in general. In the present embodiment, the single-crystal substrate having the plane orientation (100) is preferably used.

When forming a pressure chamber 18 (see FIG. 11), the single-crystal silicon substrate is processed, and anisotropic etching is generally used. The anisotropic etching is a method to employ a different etching speed relative to the plane orientation of the crystal structure. Specifically, in the anisotropic etching performed by soaking the single-crystal silicon into an alkali solution such as potassium hydrate (KOH), the etching speed of the (111) plane becomes approximately one four hundredth of the etching speed of the (100) plane. Accordingly, although a structure having an inclination of approximately 54 degrees can be formed with the plane orientation (100), because a deep groove can be etched with the plane orientation (110), a higher array density can be obtained while maintaining rigidity.

In the present embodiment, the single-crystal silicon with the plane orientation (110) may be used. In this case, it is noted that $SiO_2$ to be useable as a mask member is also etched.

Diaphragm

The diaphragm 14 deforms by receiving a force generated by the electromechanical transducer film 16, thereby causing ink droplets of the pressure chamber 18 (see FIG. 11) to be discharged. Accordingly, it is preferred that the diaphragm 14 have a predetermined rigidity.

Preferred materials for the diaphragm 14 include Si, $SiO_2$, and $Si_3N_4$ formed by chemical vapor deposition (CVD) method.

Further, materials with a linear expansion coefficient which is nearer to those of the first electrode 15 and the electromechanical transducer film 16 are preferably selected. In particular, because the electromechanical transducer film 16 employs piezoelectric zirconate titanate (PZT) as a general material, preferred materials for the diaphragm 14 include materials having a linear expansion coefficient which is nearer to $8\times10^{-6}$(1/K) and satisfies a range from $5\times10^{-6}$ to $10\times10^{-6}$, and more preferably, a range from $7\times10^{-6}$ to $9\times10^{-6}$.

More specifically, aluminum oxide, zirconium oxide, iridium oxide, ruthenium oxide, tantalum oxide, hafnium oxide, osmium oxide, rhenium oxide, rhodium oxide, palladium oxide, and chemical compounds thereof, are used. Using the above materials, the diaphragm 14 can be formed by sputtering or sol-gel method with a spin coater.

The film thickness of the diaphragm is preferably from 0.1 μm to 10 μm, and more preferably from 0.5 μm to 3 μm. When the thickness of the diaphragm 14 is below 0.1 μm, preparation of the pressure chamber 18 is difficult. If 10 μm or greater, the diaphragm 14 is not easily deformable, so that the ink droplets may not be discharged stably.

First Electrode

The first electrode 15 is preferably formed of any metal or metallic oxide. Herein, an adhesion layer is laminated between the metal film and the diaphragm 14 to prevent separation or peeling. Details of the metallic electrode film and the oxide electrode film including the adhesion layer will be described.

Adhesion Layer

A film made of titanium (Ti) is formed by sputtering, and the titanium film thus formed is oxidized with heat from 650 to 800° C., for 1 to 30 minutes, under an $O_2$ atmosphere, using a rapid thermal annealing (RTA) device, to thus obtain a titanium oxide film.

Among preparing methods for forming a titanium oxide film, the thermal oxidation method to oxidize the titanium film at a high temperature is more preferable than the reactive sputtering method. In the reactive sputtering method, a special sputtering chamber is necessary to heat the silicon substrate at a high temperature.

In addition, oxidation with the RTA device is more preferable than the oxidation using a normal furnace because the crystalline property of the titanium oxide film formed by the PTA device is optimal. If the oxidation is performed using a normal heating furnace, the titanium film apt to be oxidized easily forms many crystalline structures at a low temperature, so that those structures have to be destroyed once. As a result, the oxidation using the RTA device with a rapid temperature rising property allows optimal crystals to be formed.

Exemplary materials for use other than titanium or Ti include tantalum or Ta, iridium or Ir, rubidium or Ru, and the like.

The film thickness of the adhesion layer is preferably from 10 nm to 50 nm, and more preferably, from 15 nm to 30 nm. If the film thickness of the adhesion layer is below 10 nm, a sufficient adherence property is not obtained. If greater than 50 nm, however, an optimal crystalline property of the film formed on the adhesion layer is not obtained.

Metallic Electrode Film

Exemplary materials for the metallic electrode film in the first electrode 15 include platinum or Pt, platinum group elements such as iridium and platinum-rhodium alloys, and alloy films using these elements.

When platinum is used, considering the adherence property with the diaphragm 14 (and in particular with $SiO_2$), it is better to form the adhesion layer first, and the metallic electrode film secondly.

As the method of producing the metallic electrode film, vacuum film formation such as sputtering or vacuum deposition method is employed.

The film thickness of the metallic electrode film is preferably from 80 to 200 nm, and more preferably, from 100 to 150 nm. When the metallic electrode film is thinner than 80 nm, a sufficient current cannot be supplied to the first electrode 15, thereby adversely affecting the liquid droplet discharging. When the metallic electrode film is thicker than 200 nm, use of expensive materials such as the platinum group element increases costs. In addition, if platinum is used as the material, when the film thickness becomes gradually thicker, the surface roughness increases, which may adversely affect the surface roughness and the crystalline orientation of the oxide electrode film and PZT, and an ink discharge failure may be caused.

Oxide Electrode Film

Exemplary materials for the oxide electrode film include strontium ruthenium oxide or $SrRuO_3$ (hereinafter, "SRO"). Other than $SrRuO_3$, materials represented by $Sr_x(A)_{(1-x)}Ru_y(B)_{(1-y)}$ are preferred, in which A=Ba, Ca; B=Co, Ni; and x or y=0 to 0.5. Component ratio between Sr and Ru (Sr/Ru) is preferably 0.82 to 1.22. Outside the above range, a resistivity of the oxide electrode film increases, so that sufficient conductivity as an electrode may not be obtained.

The oxide electrode film is formed by the film formation method such as sputtering. When the $SrRuO_3$ film is formed, conditions for the sputtering should be set considering the crystalline orientation. For example, if the metallic electrode film of the first electrode 15 employs Pt (111), it is preferred that the $SrRuO_3$ film be formed with the plane orientation (111). Accordingly, the substrate is heated at a film formation temperature of 500° C. or more, for example.

For example, as to the SRO film forming condition, after the film is formed at a room temperature, the film is heated and oxidized at a crystallization temperature of 650 degrees C. in the RTA treatment. In this case, a sufficiently crystallized SRO film is obtained with a sufficient resistivity as an electrode; however, the crystalline orientation of the film tends to be formed with the plane orientation (110) preferentially, and if the PZT film is formed thereon, the PZT film tends to be in the plane orientation (110).

Examples and points for consideration will be described in forming the SRO film.

For example, as to the crystalline property of the SRO film formed on Pt(111), because the lattice constant of Pt and SRO is near, 2θ positions of the SRO (111) and Pt (111) overlap. So, it is difficult to determine the crystalline property thereof in the normal X-ray diffraction measurement using a θ-2θ method. As to Pt, diffraction lines are canceled at a position where 2θ=substantially 32° inclined by a Psi=35° due to an extinction rule and no diffraction intensity is found.

Figure 6:
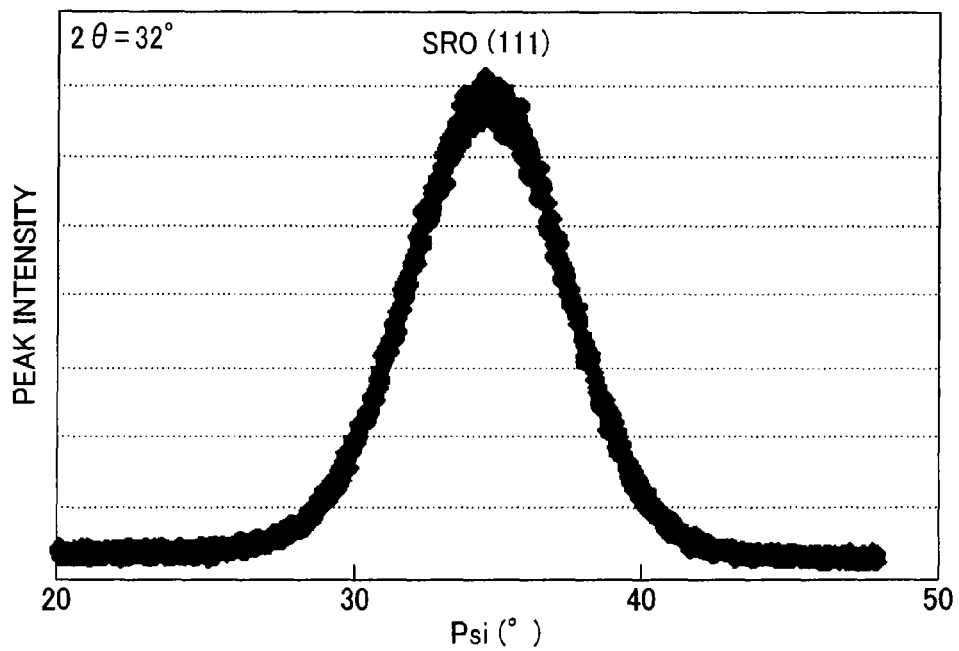
FIG. 6 is a view of an example of XRD pattern of an SRO film (111) of the electromechanical transducer element.

Thus, the orientation of Psi is inclined by substantially 35° and the peak intensity where 2θ equals near 32° is determined, so that it can confirm if the SRO is oriented in (111) preferentially. FIG. 6 illustrates a measurement result in a case where 2θ=32° is fixed and a Psi is varied.

A diffraction intensity for an SRO (110) is hardly found at Psi=0° and a diffraction intensity is found near Psi=35°, so that it is confirmed that the SRO prepared according to the present film formation condition has (111) orientation. Furthermore, a diffraction intensity for a SRO (110) is found at Psi=0° for the SRO film prepared by the RTA treatment after forming a film in the room temperature.

In addition, it was considered how much a displacement was degraded after driving repeatedly the electromechanical transducer element compared to an initial displacement. The orientation of PZT in the electromechanical transducer film 16 may give an adverse effect to the level of the degradation and the orientation of (110) may be insufficient to suppress the degraded displacement. Further, a surface roughness of the SRO film is affected by the film formation temperature. The surface roughness is reduced to 2 nm in the room temperature to 300° C. The surface roughness is measured by Atomic Force Microscope (AFM) with the surface roughness obtained by the AFM recognized as an index.

From these indices, as to the surface roughness, although the surface is flat, the crystalline property is not sufficient, so that the initial displacement and the degradation of displacement after the repeated driving of the film-formed PZT's piezoelectric actuator did not show an optimal performance. As a result, the crystalline property and the surface roughness of the SRO film should be considered.

The surface roughness of the oxide electrode film is preferably from 4 nm to 15 nm, and more preferably, from 6 nm to 10 nm. If the surface roughness is not in the above range, dielectric strength of the later-formed PZT film is degraded and leaking will occur.

To obtain the crystalline property and the surface roughness within the above range, the film formation temperature is preferably from 500° C. to 700° C., and more preferably, from 520° C. to 600° C.

The film thickness of the oxide electrode film is preferably from 40 nm to 150 nm, and more preferably from 50 nm to 80 nm. If the film thickness of the oxide electrode film is less than 40 nm, a sufficient property is not obtained as to the initial displacement and the degradation of displacement after the repeated driving. Moreover, a function as a stop etching layer to prevent an excessive etching of the PZT may not be obtained. If the film thickness thereof is larger than 150 nm, the dielectric strength of the film-formed PZT is degraded and leaking may occur.

The resistivity of the oxide electrode film is preferably $5 \times 10^{-3}$ Ω·cm or less, and more preferably, $1 \times 10^{-3}$ Ω·cm or less. If the resistivity is higher than $5 \times 10^{-3}$ ≠·cm, a sufficient current cannot be supplied, and failure occurs when the liquid droplet is discharged.

Electromechanical Transducer Film

PZT is preferably used as a material for the piezoelectric film. PZT is a solid dispersion of lead zirconate ($PbZrO_3$) and lead titanate ($PbTiO_3$) and has different properties depending on the composition ratio thereof. Composition of PZT exerting an optimal piezoelectric property is when ratios of $PbZrO_3$ and $PbTiO_3$ are 53:47, which is represented by chemical formulae: Pb ($Zr_{0.53}$, $Ti_{0.47}$)$O_3$, or in general, as PZT (53/47).

Other than PZT, the composite oxide includes barium titanate. When using barium titanate, barium alkoxide and titanium alkoxide compounds are used as initial materials, and a barium titanate precursor solution is prepared by dissolving the initial materials into a common solvent.

These materials are described by a general formula $ABO_3$, which is a composite oxide mainly including A that corresponds to Pb, Ba, or Sr, and B that corresponds to Ti, Zr, Sn, Ni, Zn, Mg, or Nb.

Specific examples include ($Pb_{1-x}$, $Ba_x$)(Zr, Ti)$O_3$, and ($Pb_{1-x}$, $Sr_x$)(Zr, Ti)$O_3$ obtained by partly replacing Pb as A with Ba or Sr. Such replacement is possible as far as the replaced element is a divalent element, and an effect of the replacement is to reduce degradation of a specific property due to evaporation of lead during thermal processing.

As a method of producing the piezoelectric film, the sputtering method or the sol-gel method may be used together with a spin coater. In this case, because a patterning is necessary, a desired pattern can be obtained by photolithographic etching, and the like.

When PZT is prepared by the sol-gel method, lead acetate, zirconium alkoxide, and titanium alkoxide as initial materials are dissolved in methoxy ethanol as a common solvent, so that a homogeneous solution can be obtained and the PZT precursor solution can be prepared. Because metallic alkoxide compounds are susceptible to hydrolysis due to moisture in the atmosphere, an appropriate amount of acetylacetone, acetic acid, diethanolamine may be added as a stabilizer to the precursor solution.

When the piezoelectric film (PZT film) is formed on an entire surface of the diaphragm 14, a coating film is formed by a solution coating method such as a spin coating, and the formed film is subjected to various thermal processes including solvent drying, thermal decomposition, and crystallization. When the coated film is transformed to the crystallized film, the volume of the film contracts. To obtain a crack-free film, the precursor density needs to be adjusted so as to obtain a film thickness less than 100 nm in one-time process.

The film thickness of the electromechanical transducer film 16 is preferably from 0.5 μm to 5 μm, and more preferably, from 1 μm to 2 μm. If the film thickness is less than 0.5 μm, preparing the pressure chamber 18 becomes difficult. If the film thickness is greater than 5 μm, the diaphragm 14 won't deform easily, resulting in unstable discharging of ink droplets. Furthermore, the diaphragm 14 may not displace sufficiently, and burden in the production process increases, thereby lengthening the processing time.

Second Electrode

The second electrode 17 preferably includes an oxide electrode film or metallic electrode film.

A preferable order is first the oxide electrode film and the metallic electrode film laminated on the oxide electrode film. The oxide electrode film and the metallic electrode film in the second electrode 17 are similar to those in the first electrode 15, so that different points alone will be described.

Oxide Electrode Film

The film thickness of the oxide electrode film in the second electrode 17 is preferably from 20 nm to 80 nm, and more preferably, from 40 nm to 60 nm. If the film thickness of the oxide electrode film is less than 20 nm, a sufficient property as to the initial displacement and the degradation characteristic may not be obtained. If greater than 80 nm, the dielectric strength of the PZT to be filmed later will be degraded and leaking may occur.

Metallic Electrode Film

The film thickness of the metallic electrode film in the second electrode 17 is preferably from 30 nm to 200 nm, and more preferably, from 50 nm to 120 nm. If the film thickness is less than 30 nm, a sufficient current cannot be supplied, and failure occurs when the liquid droplet is discharged. When the metallic electrode film is thicker than 200 nm, use of the expensive material such as the platinum group element may lead to a rise in the cost. In addition, if platinum is used as the material when the film thickness of the metallic electrode film is more than 200 nm, the surface roughness increases. If the film thickness further increases, peeling of the film may occur.

First Insulation Protective Film

Next, the first insulation protective film 21 laminated on the first electrode 15 will be described.

Dense inorganic materials are preferred for the first insulation protective film 21, because the first insulation protective film 21 prevents failures of the piezoelectric element in the film formation and etching processes and materials to which moisture in the atmosphere does not permeate need to be selected. In addition, when organic material is used for the first insulation protective film 21, the film thickness should be thick to obtain sufficient protection performance. Therefore, organic material is not preferable.

When the first insulation protective film 21 is a thick film, vibration movement of the diaphragm 14 is disturbed so much, thereby degrading a discharge property of the liquid droplet discharge head.

To obtain good protection while preventing the thickness of the first insulation protective film 21 from increasing, use of oxide, nitride, and carbonized film is preferable; however, materials having a high adherence property with materials for the electrode as a base of the first insulation protective film 21, for the piezoelectric member, and for the diaphragm, need to be selected.

Preferably, a film formation method of the first insulation protective film 21 that does not damage the piezoelectric element should be selected. Accordingly, a plasma CVD method in which reactive gas is turned into plasma which is accumulated on the substrate, or the sputtering method in which plasmas are ejected toward a target member and sputtered ions fly so that a film is formed, is not preferable. Examples of film formation methods preferably used for the first insulation protective film 21 is vapor deposition method, atomic layer deposition (ALD) method, and the like. From a wide variety of useable materials, ALD method is preferable.

Preferred materials for the first insulation protective film 21 are oxide films used for ceramics materials and include $Al_2O_3$, $ZrO_2$, $Y_2O_3$, $Ta_2O_3$, $TiO_2$, and the like. By using ALD method, a thin film having a very high density can be formed, thereby preventing any damage from occurring in the processing.

The film thickness of the first insulation protective film 21 needs to be as thin as possible to secure a protection performance of the piezoelectric element and allow the diaphragm 14 to be deformed or displaced, and is preferably from 20 nm to 100 nm. If the thickness thereof is less than 20 nm, because the function of the piezoelectric element as a protection layer becomes short, performance of the piezoelectric element decreases. When the thickness thereof is greater than 100 nm, the deformation or displacement of the diaphragm 14 decreases, thereby degrading discharging performance of the inkjet head.

The first insulation protective film 21 can be formed in two-layer structure. In this case, because a second layer of the first insulation protective film 21 is made thick, the second layer insulation film may be open near the second electrode 17 so as not to drastically disturb vibration and displacement of the diaphragm 14.

In this case, exemplary materials suitable for the second layer of the first insulation protective film 21 include oxide, nitride, carbonate, or composite compound including the foregoing materials, and alternatively, $SiO_2$ that is used in general for semiconductor devices can be used.

Known methods may be used for film formation of the second layer of the first insulation protective film 21, which may include CVD method and spattering method. CVD method capable of forming a film isotropically is preferably used considering stepwise deposition of the pattern forming part of the electrode forming part.

The film thickness of the second layer of the first insulation protective film 21 needs to have such a depth that the voltage applied to a portion between the common electrode and the individual electrode wire does not cause insulation breakdown. Specifically, the strength of the electric field applied to the insulation film needs to be set at a range that the insulation breakdown does not occur. Further, when considering the surface roughness and pin holes of the base of the insulation film, the thickness of the second layer of the first insulation protective film 21 is preferably more than 200 nm, and more preferably, more than 500 nm.

Lead Wire and Electrode Pad

It is preferred that the materials for the wires 27, 28 and electrode pads 23, 24 be metallic materials formed of any one of Ag alloy, Cu, Al, Au, Pt, and Ir. Those electrodes can be formed using a sputtering method, spin coating method, and the like, and thereafter, a desired pattern is obtained via photolithographic etching, and the like. The film thickness of the pad electrode is preferably from 0.1 μm to 20 μm, and more preferably, from 0.2 μm to 10 μm. If the thickness is less than 0.1 μm, the resistivity increases, and enough current cannot be supplied to the electrode, so that head discharge may become unstable. By contrast, if the thickness is more than 20 μm, the processing time becomes longer.

In addition, a contact resistance at the contact holes (for example, with an area 10 μm×10 μm) through which the common electrode and the individual electrode are connected, is preferably set to less than 10Ω for the common electrode and less than 1Ω for the individual electrode. More preferably, less than 5Ω for the common electrode and less than 0.5Ω for the individual electrode. If the resistance is higher than the above range, a current cannot be supplied sufficiently and failure occurs when the liquid droplet is discharged.

Second Insulation Protective Film

The second insulation protective film 22 serves as a passivation layer to protect the individual electrode wire and the common electrode wire. As illustrated in FIG. 3, the second insulation protective film 22 covers the individual electrode and the common electrode without a lead wiring portion of the individual electrode and a lead wiring portion of the common electrode. With this structure, aluminum Al or an alloy mainly formed of Al may be used for the material of the electrode. As a result, a low-cost and highly-reliable inkjet recording head can be obtained.

Materials for the second insulation protective film include any inorganic or organic materials. Organic materials can be used but with a low moisture permeability. Exemplary inorganic materials include oxide, nitride, and carbonate, and exemplary organic materials include polyimide, acrylic resin, and urethane resin. However, if organic material is used, the film thickness needs to be large, so that organic materials are not suitable for patterning. In addition, inorganic materials are preferable because the wiring protection function is exerted even with a thin film. In particular, use of $Si_3N_4$ on Al wiring that exerts efficiency for use in the semiconductor devices, is preferable.

Further, the thickness of the second insulation protective film 22 is preferably more than 200 nm, and more preferably, more than 500 nm. If the thickness is less than 200 nm, an enough passivation effect cannot be exerted, and breaking of wire occurs due to corrosion of the wire materials, thereby degrading reliability in inkjet discharging performance.

Furthermore, it is preferred that openings be disposed on the piezoelectric element and the diaphragm around the piezoelectric element. This is based on the same reason that the first insulation protective film 21 includes a thin film area around the individual liquid chamber. With this configuration, a highly efficient and reliable inkjet head can be formed.

Because the piezoelectric element is protected by the first and second insulation protective films 21, 22, the openings can be formed by the photolithography and/or dry etching.

Polarization

As illustrated in FIG. 1A, polarization orientations of the electromechanical transducer element in the domain 50 are varied before applying voltage. After repeated voltage application, polarization orientations become oriented at a certain degree as illustrated in FIG. 1B. Due to this, the displacement of the electromechanical transducer element decreases.

By contrast, when the electromechanical transducer element is subjected to polarization, changes in the displacement are converged in an early stage, thereby reducing the chronological change of the driving force of the electromechanical transducer element.

Polarization can be Referred to as a Poling Treatment or an Aging Treatment.

Polarization of the electromechanical transducer element is performed such that corona discharge or glow discharge is performed and the generated electrical charge is applied to the electromechanical transducer element via the pad portion.

Figure 7:
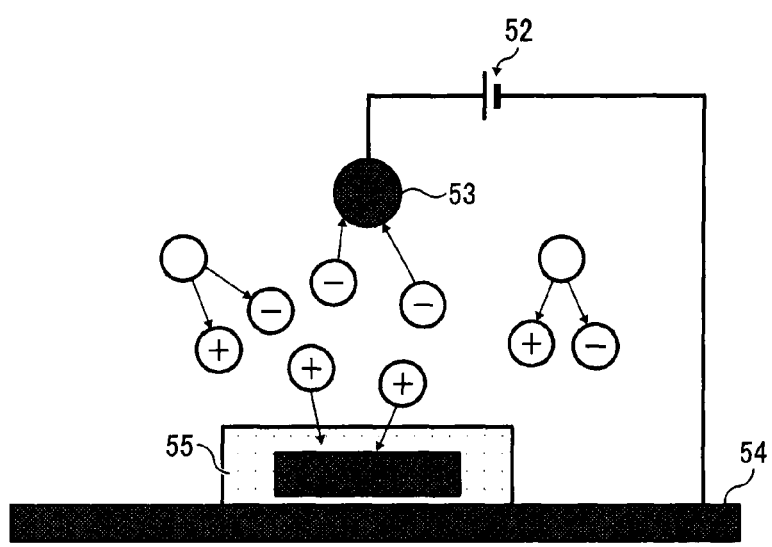
FIG. 7 schematically illustrates corona discharge.

As illustrated in FIG. 7, a corona electrode 53 is connected to a flat electrode 54 via a power source 52. When the voltage is applied, molecules in the atmosphere are ionized continuously. Ionized positive and negative ions move along the electric field generated between the corona electrode 53 and the flat electrode 54, the positive ions flow in a target piezoelectric element 55 disposed between the corona electrode 53 and the flat electrode 54.

Next, polarized state will be described.

Figure 8A:
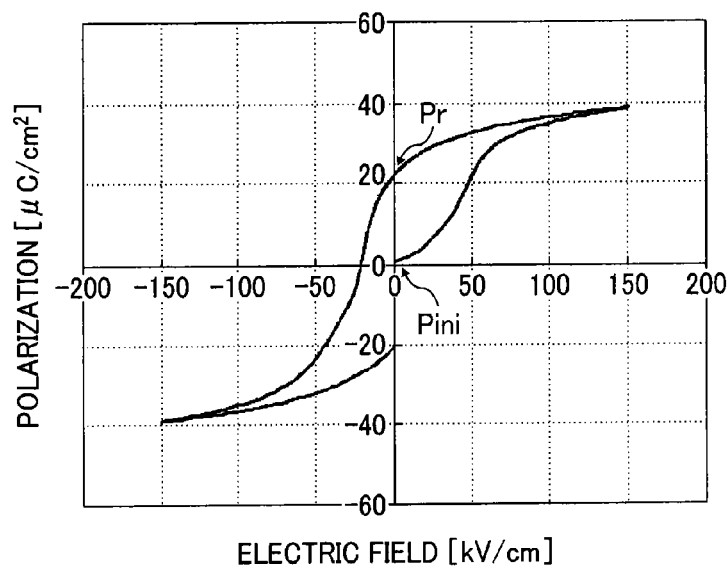
FIGS. 8A and 8B illustrate examples of a hysteresis loop for explaining a polarized state.

A state in polarization can be determined from a P-E hysteresis loop. As illustrated in FIG. 8A, a hysteresis loop is measure by applying an electric field. A polarization amount in an initial state at a first 0 kV/cm is defined as Pini, and another polarization amount when the polarization amount returns to 0 kV/cm after applying voltage is defined as a remaining polarization amount Pr. Herein, a difference between Pr and Pini (i.e., Pr-Pini) is defined as a polarization amount difference.

Figure 8B:
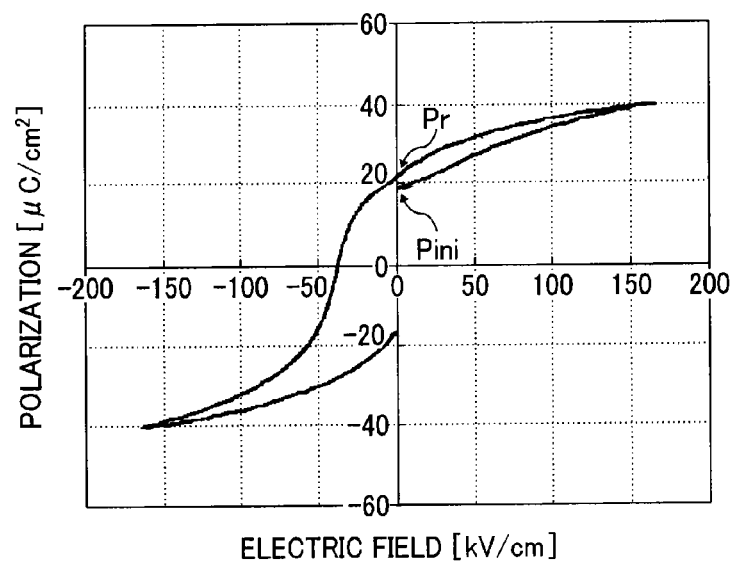

It is determined that the polarization proceeds as the polarization amount difference becomes less. The amount of Pini in the state where no polarization treatment is performed is near to zero as illustrated in FIG. 8A. When polarization is performed, the amount of Pini increases as illustrated in FIG. 8B. As polarization proceeds, the polarization amount difference Pr-Pini decreases. Herein, it can be said that polarization is performed sufficiently when the polarization amount difference is less than $10\ \mu C/cm^2$, and further less than $5\ \mu C/cm^2$. When the above amount exceeds $10\ \mu C/cm^2$, a sufficient performance cannot be obtained due to the displacement degradation after a continuous drive as a piezoelectric actuator.

Figure 9:
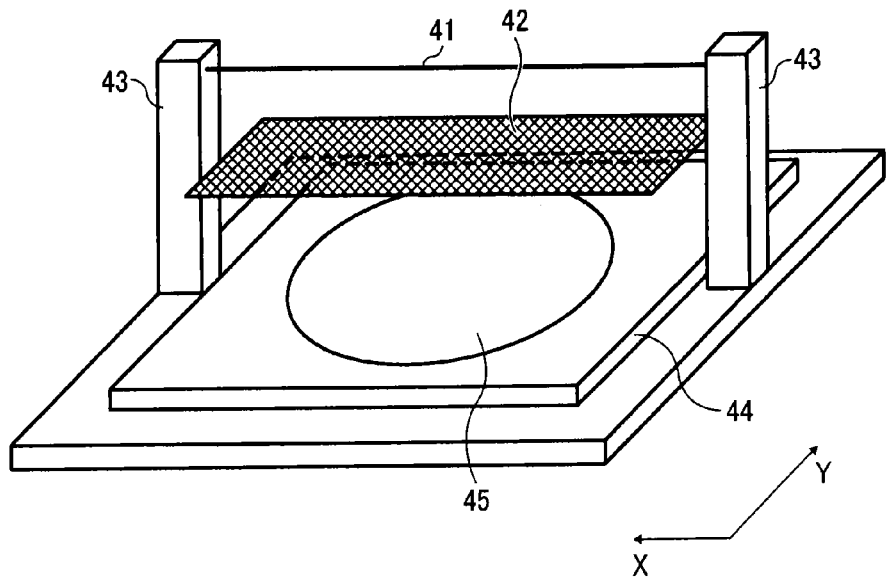
FIG. 9 schematically illustrates an exemplary structure of corona polarization equipment.

FIG. 9 shows an exemplary structure of a polarization treatment device. The polarization treatment device includes a corona electrode 41, a grid electrode 42, supporters 43, and a sample stage 44 on which a sample is secured. As illustrated in FIG. 9, the corona electrode 41 and the grid electrode 42 are connected to a power source for the corona electrode 41 and a power source for the grid electrode 42, respectively, and the corona electrode 41 is a wire-shaped electrode. The level of the voltage to be applied to the corona electrode 41 or the grid electrode 42, and a distance between each electrode and the sample stage 44 are not limited in particular, but can be adjusted so that polarization can be performed sufficiently. The intensity of the corona discharge is thus appropriately adjusted.

The structure of the corona electrode 41 is not limited in particular, can be formed in a wire shape or needle shape, and can be formed of various conductive materials. In the present embodiment, a wire-shaped electrode is optimally used, of which diameter is appropriately $50\ \mu m$. Preferred materials for the corona electrode 41 may include, but not limited to, tungsten, stainless steel, and the like. A surface of tungsten is polished, and carbon coating or gold plating is applied thereto can also be employed.

In addition, as illustrated in FIG. 9, the grid electrode 42 is connected to the power source for the grid electrode 42 and is disposed between the corona electrode 41 and the sample stage 44. Preferred materials for the grid electrode 42 may include known materials such as stainless steel and tungsten.

The grid electrode 42 is preferably configured such that shaping or mesh treatment is performed, and that ions and electrical charge generated by the corona discharge effectively and uniformly fall on the sample stage 44 when a high voltage is applied to the corona electrode 41.

Preferred materials for the sample stage 44 include conductive materials without any limitation as far as the corona discharge can be performed, and stainless steel and other metallic plate can be preferably used.

The sample stage 44 preferably includes a heating member to heat the sample. This is because the sample can be treated while moderating the reactive force of the sample when polarization treatment is performed while heating, thereby preventing a crack in the sample from occurring even though much electrical charge is applied to the sample so as to obtain a desired polarization state. The heating member is not limited in particular, but various types of heaters and lamps can be used. In addition, the heating member can be disposed inside the sample stage 44, but the heating member can be disposed to heat the sample stage 44 from outside. The heating member is preferably disposed inside the sample stage 44 to prevent interference with the electrode in particular.

A maximum heating temperature of the heating member is not limited in particular, and may only be configured such that the heating member can heat at a predetermined temperature in accordance with Curie temperature of the electromechanical transducer film of the piezoelectric element. In particular, to cope with the various types of piezoelectric elements, the heating member preferably heats up to 350° C. at the maximum. The heating temperature in an actual polarization treatment is not limited in particular, but preferably at less than Curie temperature. This is because, when the heating is performed at a temperature exceeding Curie temperature, even though polarization is performed, depolarization occurs again, and effects of polarization will be lost.

In addition, to securely prevent the temperature of the electromechanical transducer film from exceeding Curie temperature, the heating member preferably heats at half the temperature of Curie temperature, and more preferably, one third thereof. For example, when PZT (piezoelectric zirconate titanate) is used for electromechanical transducer film, it is preferred that the heating is performed at less than 180° C., and more preferably, at less than 120° C.

The sample stage 44 is preferably grounded so that electrical charge can be applied easily to a target polarized material.

The sample stage 44 is preferably provided with a moving member to move the sample so that the sample can be treated entirely because the area in which electrical charge is applied to the sample in the corona discharge is limited. The moving member is not limited in particular, but alternatively, the sample stage 44 can be movably configured.

The electrical charge amount Q required for polarization is not limited in particular, but the electromechanical transducer element is charged with the electrical charge of equal to and more than $1.0 \times 10^{-8}$ C, and more preferably, equal to or more than $4.0 \times 10^{-8}$ C. If the electrical charge amount Q is less than $1.0 \times 10^{-8}$ C, polarization treatment is not performed sufficiently, so that a sufficient performance cannot be obtained for the piezoelectric actuator of the PZT with respect to the displacement degradation after repeated driving.

Figure 10:
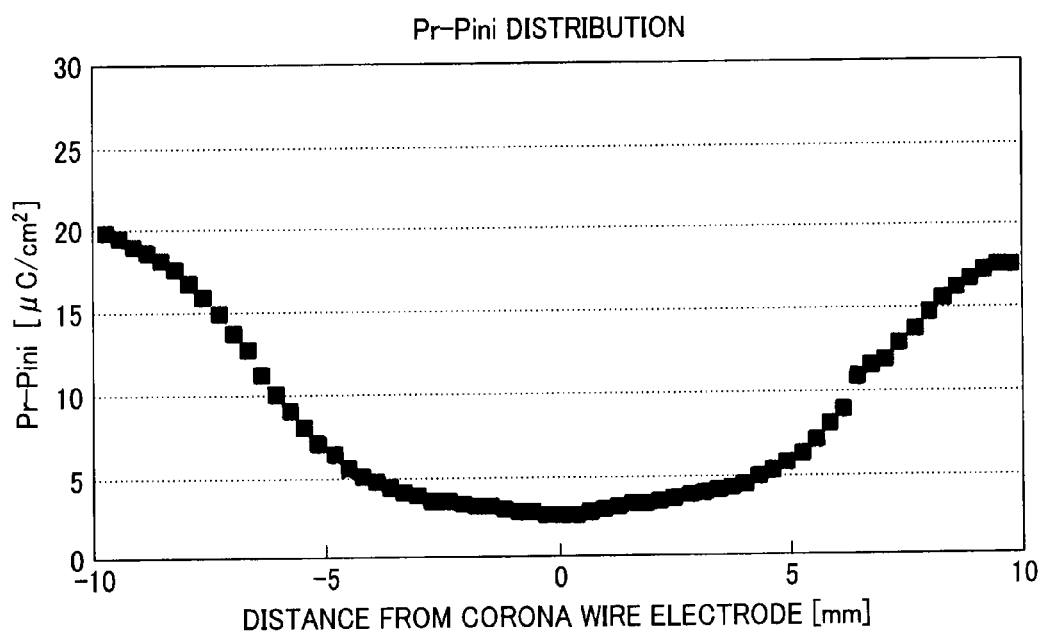
FIG. 10 illustrates Pr-Pini distribution when the polarization treatment is performed with the corona electrode fixed in place.

FIG. 10 illustrates Pr-Pini distribution when polarization is performed with the corona electrode fixed in place. When the pad size is the same, as illustrated in FIG. 10, it is understood that the polarization is degrading as the target polarized material is gradually away from the electromechanical transducer element disposed right below the corona wire electrode.

Method of Producing Electromechanical Transducer Element

A method of producing the electromechanical transducer element according to an exemplary embodiment of the present invention includes producing a common electrode on a substrate; producing an electromechanical transducer film on the common electrode; producing an individual electrode on the electromechanical transducer film; producing a common electrode pad electrically connected to the common electrode; producing an individual electrode pad electrically connected to the individual electrode; and producing an insulation protective film on the common electrode and the individual electrode to cover a side surface of the individual electrode pad. Further, included are applying the electrical charge generated in the corona discharge in the individual electrode pad to perform a polarization treatment, and other treatment if needed.

As described above, the insulation protective film contacts an upper end of the individual electrode pad, and a thickness of the insulation protective film around the individual electrode pad becomes gradually thinner from the end of the individual electrode pad outward. The method for corona discharge is not limited in particular, but may employ the polarization treatment device described above. In addition, the individual electrode pad is preferably positively charged with the electrical charge generated by the corona discharge.

Inkjet Recording Head

An inkjet recording head according to an embodiment of the present invention will be described.

Figure 11A:
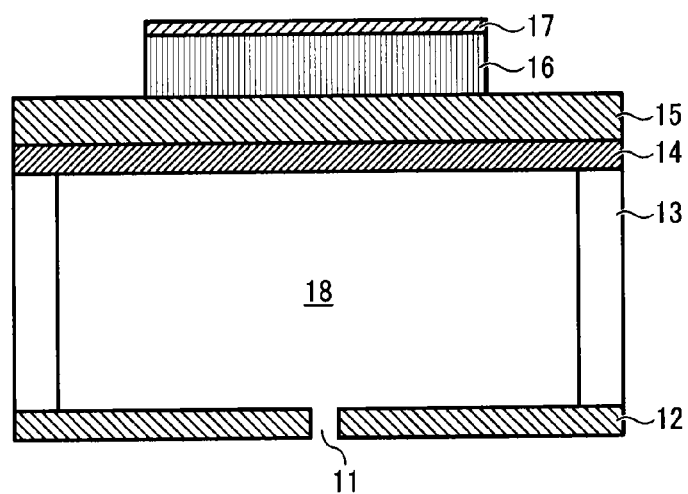
FIGS. 11A and 11B schematically illustrate an example of a structure of an inkjet recording head.
Figure 11B:
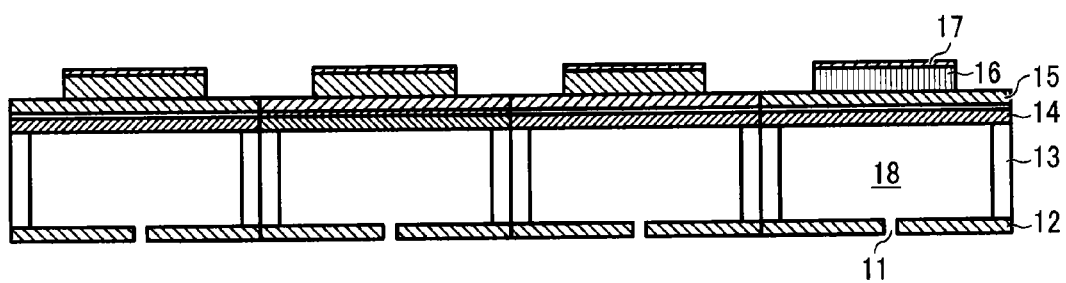

As illustrated in FIG. 11A, an inkjet recording head includes a nozzle 11, a nozzle plate 12, and a pressure chamber 18. As illustrated in FIG. 11B, a plurality of recording heads can be employed.

According to the present invention, the electromechanical transducer element can be formed with simple steps of production with the same performance as in the bulk ceramics. Thereafter, the pressure chamber is formed by etching removal from a rear surface of the electromechanical transducer element, and the nozzle plate 12 including a nozzle hole is joined, thereby producing the inkjet recording head. Descriptions of liquid supply means, liquid supply channel and fluid resistance are omitted.

Inkjet Recording Apparatus

Figure 12:
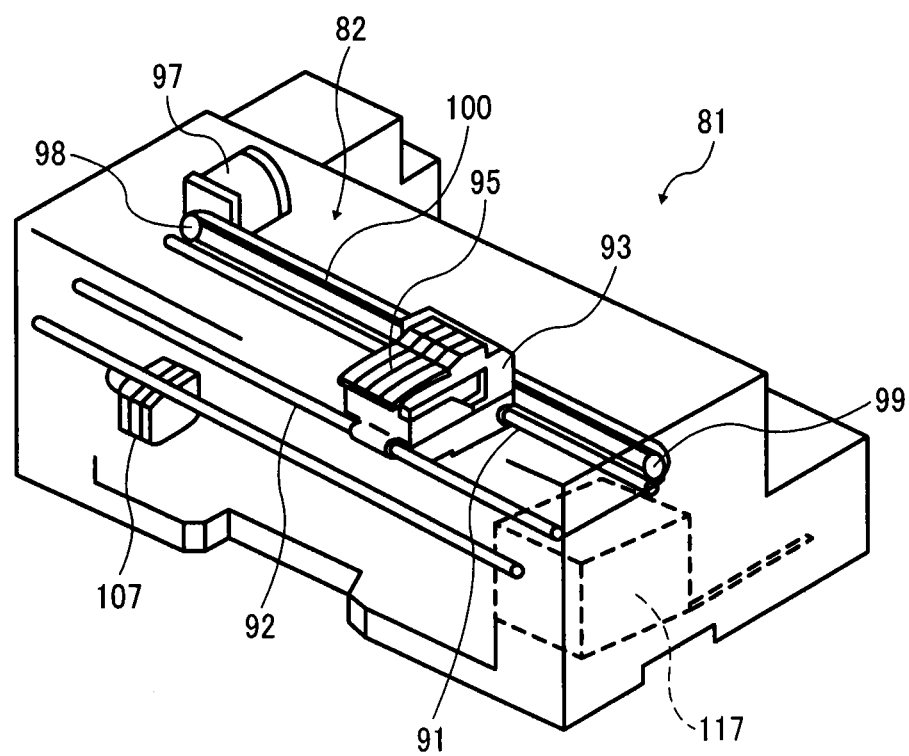
FIG. 12 schematically illustrates a perspective view of an inkjet recording apparatus.
Figure 13:
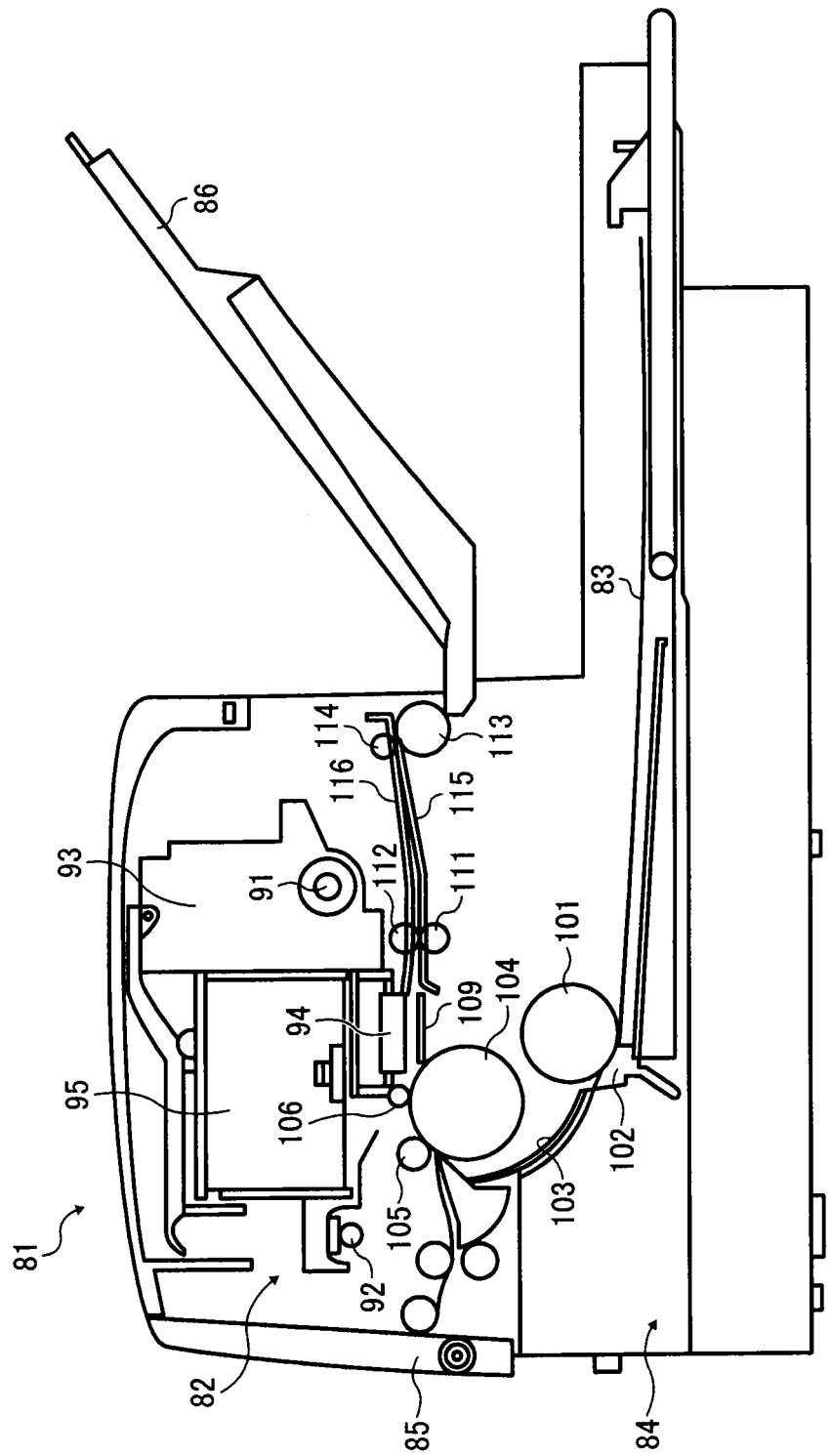
FIG. 13 schematically illustrates a perspective side view of an inkjet recording apparatus.

An inkjet recording apparatus including an inkjet recording head according to an exemplary embodiment of the present invention will be described. FIGS. 12 and 13 schematically illustrate an exemplary inkjet recording apparatus 81. FIG. 12 is a perspective view of the inkjet recording apparatus, and FIG. 13 is a side view illustrating a structural part of the inkjet recording apparatus.

The inkjet recording apparatus 81 further includes a carriage disposed inside the body thereof to be movable in a main scanning direction, an inkjet recording head mounted on the carriage, and a printing unit 82 including ink cartridges to supply ink to the recording head.

A paper tray 84 on which a plurality of sheets 83 can be stacked is disposed at a front, bottom side of the inkjet recording apparatus 81. A manual tray 85 to feed the sheet 83 manually can be used by bending to open it. The sheet 83 fed out from the paper tray 84 or the manual tray 85 is conveyed to the printing unit 82, where a predetermined image is recorded thereon, and is discharged to a paper ejection tray 86 disposed at the rear side of the apparatus.

The printing unit 82 includes a main guide rod 91 and an auxiliary guide rod 92, which are guide members disposed laterally between right and left side plates and slidably hold the carriage 93 to be movable in a main scanning direction.

A recording head 94 is mounted on the carriage 93. The recording head 94 includes inkjet recording heads to discharge ink droplets of respective colors of yellow (Y), cyan (C), magenta (M), and black (K) according to the present embodiment. The recording head 94 includes a plurality of ink discharge ports or nozzles arranged in a sub-scanning direction perpendicular to the main scanning direction, with the ink discharging direction oriented downward. Ink cartridges 95 to supply ink of respective colors to the recording head 94 are mounted replaceably to the carriage 93.

The ink cartridge 95 includes an upper hole to communicate with external air, a supply port to take in the ink and disposed on a bottom thereof, and a porous body in an inside thereof. The ink supplied to the inkjet head is kept at a slight negative force due to capillary force of the porous body. In the exemplary embodiment, a plurality of recording heads 94 for respective colors are used as the recording head; however, one single recording head including nozzles to discharge ink droplet of each color may be employed.

The carriage 93 slidably engages a main guide rod 91 at the rear side of the apparatus (downstream in the sheet conveyance direction) and slidably engages an auxiliary guide rod 92 at the front side of the apparatus (upstream in the sheet conveyance direction). To move the carriage 93 in the main scanning direction, a timing belt 100 is disposed between a drive pulley 98 driven by a main scanning motor 97 and a driven pulley 99. The timing belt 100 is fixed to the carriage 93, so that the carriage 93 is driven to move reciprocally back and force due to the back and force rotation of the main scanning motor 97.

On the other hand, to convey the sheet 83 placed in the paper tray 84 below the recording head 94, a sheet feed roller 101 and a friction pad 102, both to separate and convey the sheet 83 one by one, and a guide member 103 to guide the sheet 83, are provided. Further, a conveyance roller 104 to reverse and convey the fed sheet 83, another conveyance roller 105 to be pressed against a peripheral surface of the conveyance roller 104, and a front end roller 106 to define a conveyance angle of the sheet 83 from the conveyance roller 104, are provided. The conveyance roller 104 is driven by a sub-scan motor 107 via a gear array.

Further, a sheet receiver 109 is disposed below the recording head 94 to guide the sheet 83 conveyed from the conveyance roller 104 corresponding to a moving range of the carriage 93 in the main scanning direction. Further, a conveyance roller 111 and a spur 112 are disposed downstream of the sheet receiver 109 in the sheet conveyance direction and rotate to convey the sheet 83 to a sheet ejection direction. Furthermore, a paper ejection roller 113 and a spur 114 to send out the sheet 83 to a sheet ejection tray 86 and guide members 115, and 116 to form a sheet ejection path are disposed.

In recording operation, the recording head 94 is driven in response to image signals, while moving the carriage 93, to allow the head 94 to discharge ink droplets onto the stopped sheet 83 to record a single line. After the sheet 83 is conveyed by a predetermined amount, a next line is recorded. Upon receiving a recording end signal or a signal indicating that a trailing edge of the sheet 83 has reached the recording area, the recording operation is terminated and the sheet 83 is ejected.

Further, a recovery unit 117 to recover discharge failure of the recording head 94 is disposed at a right end side in the moving direction of the carriage 93 and outside the recording area.

In the standby time, the carriage 93 moves to the recovery unit 117, where the recording head 94 is capped by the cap, so that the discharging port of the recording head 94 is kept moisturized and discharge failure due to ink drying can be prevented. In addition, by discharging unnecessary ink for recording during operation, ink viscosity of all discharging ports is kept constant, thereby maintaining stable discharging performance.

When discharge failure occurs, the discharging port or the nozzle of the recording head 94 is sealed by the cap, and the suction means sucks ink and bubbles from the nozzle, so that the ink and foreign materials adhered around the discharging port are removed by the cleaner and the discharging failure can be recovered. The sucked ink is discharged in a waste ink reservoir disposed in the bottom of the apparatus, and is absorbed by an ink absorber disposed inside the waste ink reservoir.

The inkjet recording apparatus according to the embodiment of the present invention can suppress the ink droplet discharge failure due to defective driving of the diaphragm, and fluctuation of the displacement can be suppressed, thereby stabling the ink droplet discharge performance and improving the image quality.

Hereinafter, exemplary embodiments of the present invention will be described with a comparative example. The present invention, however, is not limited to the following embodiments alone.

First Example

Production of Electromechanical Transducer Element

A thermal oxidation film (with a film thickness of 1 μm) was formed on a 6-inch silicon wafer (with a film thickness of 625 μm), a titanium film (with a film thickness of 30 nm) was formed as an adhesion layer for the first electrode 15 by sputtering, and then, was subjected to thermal oxidation at 750° C. using the RTA.

Successively, a platinum film (with a film thickness of 100 nm) was formed as a metallic electrode film on the titanium film, and $SrRuO_3$ film (with a film thickness of 60 nm) as an oxide electrode film was formed by sputtering. The film formation by the sputtering was performed heating the substrate at 550° C.

Next, the electromechanical transducer film 16 was formed by spin coating using a PZT precursor solution of which composition ratios are adjusted to Pb:Zr:Ti=114:53:47, respectively. A synthesis of a coating liquid of the PZT precursor solution will be described below.

As starting materials, lead acetate trihydrate, titanium isopropoxide, and zirconium isopropoxide were used, and crystallization water of lead acetate was dissolved in methoxyethanol and dehydrated. The amount of lead is made excessive against the stoichiometric composition to prevent crystalline property from decreasing due to a so-called lead evaporation during the thermal treatment.

Next, titanium isopropoxide and zirconium isopropoxide were dissolved in methoxyethanol to promote an alcohol exchange reaction and an esterification reaction. The thus-obtained solution was mixed with the methoxyethanol solution in which the lead acetate was dissolved as described above, thereby preparing a PZT precursor solution. Concentration of PZT in the PZT precursor solution was 0.5 mol/liter.

Using the PZT precursor solution as a coating liquid, an electromechanical transducer film 16 was formed by spin coating, dried at 120° C., and thermally decomposed at 500° C. After thermal decomposition treatment for a third layer, a crystallization thermal treatment was performed at 750° C. by the RTA. Herein, a film thickness of RZT was 240 nm. This series of processes are performed eight times for 24 layers, to thus obtain a PZT film with a film thickness of approximately 2 μm.

Next, a $SrRuO_3$ film (with a film thickness of 40 nm) as an oxide electrode film of the second electrode 17 and a platinum film having a film thickness of 125 nm as a metallic electrode film were formed by sputtering. Thereafter, film formation was performed on Photoresist (TSMR8800, product name) produced by Tokyo Ohka Kogyo Co., Ltd. by spin coating, a resist pattern was formed using a normal photolithography, and a pattern was formed using ICP etching device (produced by SAMCO Inc.).

Next, as the first insulation protective film 21, $Al_2O_3$ film with a thickness of 50 nm was formed by ALD method. Herein, Trimethylaluminum (TMA) (produced by Sigma-Aldrich Co. LLC.) was used as a material for aluminum, and $O_3$ generated by an ozone generator was used as a material for hydrogen. They are used alternately to promote film formation. Thereafter, contact holes 25, 26 were formed by etching, the individual electrode lead wire 28 and the common electrode lead wire 27 were film-formed using aluminum by sputtering and individualized by etching.

Next, as the second insulation protective film 22, $Si_3N_4$ was film-formed by plasma CVD method to have a film thickness of 500 nm, the individual electrode pad 24 and the common electrode pad 23 were formed by etching, and the electromechanical transducer element as illustrated in FIGS. 3 and 4 was formed.

When $Si_3N_4$ was etched, conditions for lithography and etching were adjusted stepwise such that the thickness of the second insulation protective film 22 gradually reduces its thickness. In this case, the individual electrode pad 24 had a shape as illustrated in FIG. 5B.

Polarization Treatment

The polarization treatment device as illustrated in FIG. 9 was used. In the present embodiment, as a corona electrode 41, a tungsten wire with a diameter of 50 μm was used, and a stainless grid with an opening rate 60% was used as a grid electrode 42. Applied voltage was 9.0 kV.

Second Example

When $Si_3N_4$ was etched, the second insulation protective film 22 and the individual electrode pad 24 were etched in greater area than that of the individual electrode pad 24, so that the second insulation protective film 22 and the individual electrode pad 24 were the same in height. In this case, the individual electrode pad 24 had a shape as illustrated in FIG. 5A. In addition, polarization was performed similarly to the first example.

Comparative Example

When $Si_3N_4$ was etched, etching was performed with conventional conditions for lithography and etching. In this case, the individual electrode pad 24 had a shape as illustrated in FIG. 5C. In addition, polarization was performed similarly to the first example.

Evaluation

Evaluation of Polarization State>

Polarizability and a crack generation rate were measured in each of the first and second examples and comparative example. The crack generation rate was first measured by measuring cracks generated by polarization using a differential interference microscope, and was obtained by dividing the number of electromechanical transducer elements in which a crack is generated by a total number (approx. 1,200) of the electromechanical transducer elements. Table 1 shows an evaluation result.

TABLE 1

| | Polarizability ($\mu C/cm^2$) | Crack generation rate (%) |
| --- | --- | --- |
| First example | 2.8 | 0 |
| Second example | 2.9 | 0 |
| Comparative example | 2.4 | 9 |

The polarizability is less than 5 μC/cm² in each of the first and second examples and the comparative example, so that it is understood that polarization is optimally performed. By contrast, the crack generation rate in the first and second examples was 0%, and 9% in the comparative example. This is considered due to a concentration in the insulation protective film, and as a result, insulation breakdown occurs to the electromechanical transducer element.

Figure 14:
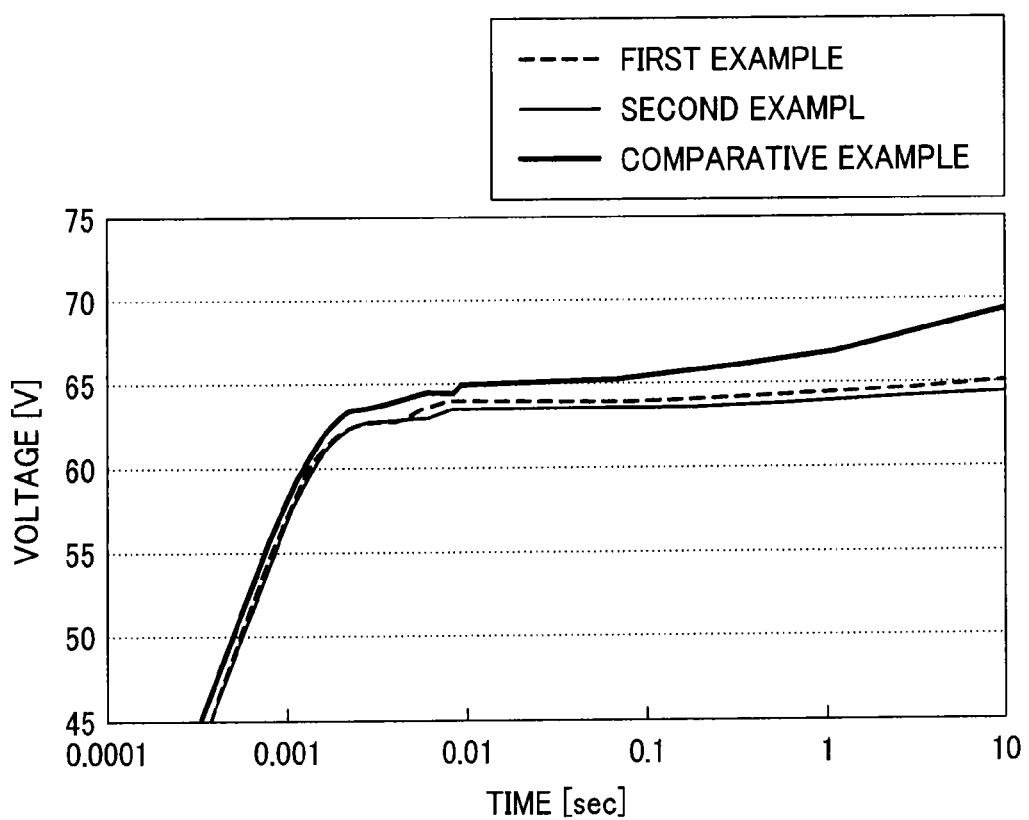
FIG. 14 is a graph showing a relation between a discharging time and an electric potential in the first and second examples and in a comparative example.

FIG. 14 is a graph showing a relation between a charging time and an electric potential in first and second examples and in the comparative example. In the first and second examples, the electric potential does not change a lot compared to the charging time. By contrast, it can be seen that the electric potential increases as the charging time lengthens in the comparative example. This is because insulation breakdown occurs to the electromechanical transducer element and the ink discharge stability is degraded.

Inkjet Head Evaluation

Using the electromechanical transducer element formed in the first and second examples and the comparative example, inkjet recording heads as illustrated in FIG. 11B were formed, respectively, and droplet discharging performance of each examples was evaluated. Ink with adjusted viscosity of 5 cp was used and droplet discharging performance was evaluated by applying voltage of 10 to 30 volts having a simple Pull waveform. Discharging performance of the inkjet recording heads according to the first and second embodiments was excellent; however, the inkjet recording heads according to the comparative example includes nozzles that do not discharge ink.

Additional modifications and variations of the present invention are possible in light of the above teachings. It is therefore to be understood that, within the scope of the appended claims, the invention may be practiced other than as specifically described herein.

What is claimed is:

1. An electromechanical transducer element comprising:
   a substrate;
   a common electrode disposed on the substrate;
   an electromechanical transducer film formed on the common electrode;
   an individual electrode formed on the electromechanical transducer film;
   a common electrode pad electrically connected to the common electrode;
   an individual electrode pad electrically connected to the individual electrode; and
   an insulation protective film formed on the common electrode and the individual electrode, contacting an upper end of the individual electrode pad, and surrounding a side surface of the individual electrode pad,
   the insulation protective film having a gradually decreasing thickness outward from an end of the individual electrode pad.

2. The electromechanical transducer element as claimed in claim 1,
   wherein the insulation protective film covers the upper end of the individual electrode pad and has a gradually decreasing thickness that gradually decreases inward from the end of the individual electrode pad.

3. The electromechanical transducer element as claimed in claim 1,
   wherein a film thickness of the insulation protective film is greatest at a position contacting the upper end of the individual electrode pad, and gradually decreases outward from the end of the individual electrode pad.

4. The electromechanical transducer element as claimed in claim 1,
   wherein the insulation protective film surrounds a side surface of the common electrode pad and contacts an upper end of the common electrode pad, and the insulation protective film around the common electrode pad has a gradually decreasing thickness outward from the end of the common electrode pad.

5. An inkjet recording head comprising an electromechanical transducer element,
   the electromechanical transducer element, comprising:
   a substrate;
   a common electrode disposed on the substrate;
   an electromechanical transducer film formed on the common electrode;
   an individual electrode formed on the electromechanical transducer film;
   a common electrode pad electrically connected to the common electrode;
   an individual electrode pad electrically connected to the individual electrode; and
   an insulation protective film formed on the common electrode and the individual electrode, contacting an upper end of the individual electrode pad, and surrounding a side surface of the individual electrode pad, the insulation protective film having a gradually decreasing thickness outward from an end of the individual electrode pad.

6. An inkjet recording apparatus comprising the inkjet recording head as claimed in claim 5.

7. A method of producing an electromechanical transducer element, comprising:
   preparing a common electrode on a substrate; preparing an electromechanical transducer film on the common electrode;
   preparing an individual electrode on the electromechanical transducer film;
   preparing a common electrode pad so as to electrically connect to the common electrode;
   preparing an individual electrode pad so as to electrically connect to the individual electrode;
   preparing an insulation protective film on the common electrode and the individual electrode so as to surround a side surface of the individual electrode pad, contact an upper end of the individual electrode pad, and have a gradually decreasing thickness outward from the upper end of the individual electrode pad around the individual electrode pad; and
   performing a polarization treatment by applying electrical charge generated by a corona discharge to the individual electrode pad.

8. The method as claimed in claim 7,
   wherein electrical charge generated by the corona discharge is a positive charge.

9. An electromechanical transducer element produced by the method of claim 7.

* * * * *